QUIESCENT CURRENT STABILIZED TRANSISTOR AMPLIFIER
Filed Oct. 19, 1966
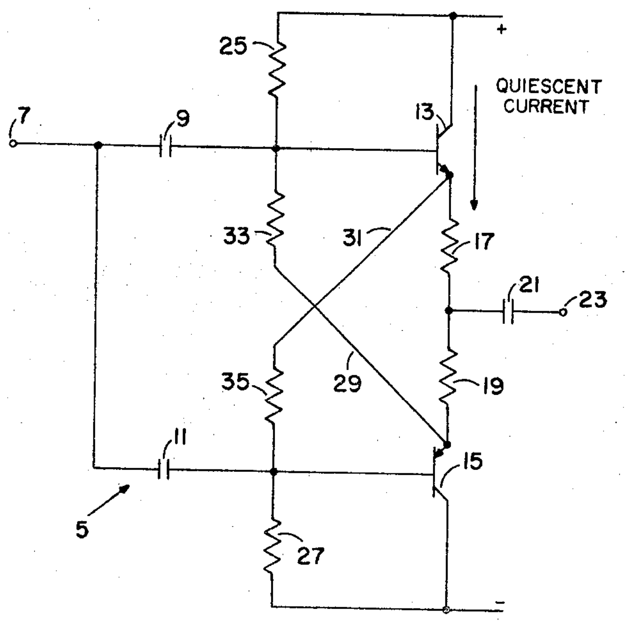
Bjorn H. Engelhardt,
INVENTOR.
Harry M. Saragovitz
BY Edward J. Kelly
Herbert Berl
Jack W. Voigt United States Patent Office 3,405,367

Patented Oct. 8, 1968

3,405,367

QUIESCENT CURRENT STABILIZED TRANSISTOR AMPLIFIER

Björn H. Engelhardt, Orlando, Fla., assignor, by mesne assignments, to the United States of America as represented by the Secretary of the Army Filed Oct. 19, 1966, Ser. No. 588,675
1 Claim. (Cl. 330—13)

ABSTRACT OF THE DISCLOSURE

A transistor push-pull amplifier having a feedback loop for quiescent current stabilization. Emitter resistors are added to the output transistors for developing voltage across these resistors to provide a larger feedback voltage for stabilizing the quiescent current which will change due to aging, temperature, and other reasons.

The present invention relates to a transistor amplifier and more particularly to a transistorized push-pull amplifier having a feedback loop for quiescent current stabilization.

In order to reduce crossover modulation in a push-pull, low frequency output stage of the transformerless type, it is desirable to establish a quiescent current to flow through the output transistors. To maintain this current at a constant value, emitter resisors are added to the output transistors and the present invention takes advantage of the voltage developed across these resistors to provide a larger feedback voltage for stabilizing the quiescent current which will change due to aging, temperature, etc.

It is, therefore, an object of this invention to provide a transistorized push-pull amplifier having a more effective feedback loop for stabilizing quiescent current.

Another object of this invention is to provide feedback stabilization in a transformerless type push-pull amplifier.

Still another object of this invention is to provide a push-pull amplifier of the transformerless type which substantially reduces crossover modulation.

Further, it is an object of this invention to provide a less expensive means for maintaining stabilized quiescent current in a transistorized push-pull amplifier even though circuit parameters change due to aging, temperature, or other environmental changes.

Other objects and many of the attendant advantages of this invention will be readily appreciated as the same becomes better understood by reference to the following detailed description when considered in connection with the accompanying drawing wherein:

The single figure is a schematic diagram of a quiescent current stabilized transistor amplifier, according to the present invention.

Referring now to the drawing, wherein for the purpose of illustration only, there is shown an amplifier 5 having an input terminal 7 which is connected commonly to coupling capacitors 9 and 11, these in turn connecting with the base leads of transistors 13 and 15 respectively which are opposite conductivity type transistors. From the emitter leads of transistors 13 and 15, respectively, the circuit is completed through emitter resistors 17 and 19 to a common connection at one lead of a coupling capacitor 21 which further connects to an output terminal 23 of amplifier 5. The circuit is biased by means of a bias voltage applied between the collector of transistor 13 and the collector of transistor 15 while the base bias is provided by means of resistors 25 and 27 connected respectively between the collectors and bases of transistors 13 and 15.

In order to stabilize the quiescent current flowing through transistors 13 and 15, resistors 17 and 19 provide feedback voltages which are sensed by the bases of transistors 13 and 15 respectively by means of connection leads 29 and 31 respectively, lead 29 being connected between the emitter of transistor 15 and a biasing resistor 33 which is, in turn, connected to the base of transistor 13 and lead 31 being connected between the emitter of transistor 13 and a biasing resistor 35 which is, in turn, connected to the base of transistor 15.

IN OPERATION

Resistors 17 and 19 provide feedback voltage to stabilize the quiescent current flowing through transistors 13 and 15 under no signal conditions. The magnitude of the current is determined primarily by the supply voltage, the base-emitter voltage, and the resistance networks. After the circuit has been designed for a specific quiescent current, a change in its magnitude (due to aging for transistors, temperature fluctuation, etc.) will produce a voltage change across resistors 17 and 19. The full voltage change is applied to transistor biasing networks consisting of resistors 25, 33 and 27, 35 for transistors 13 and 15 respectively as a negative D.C. feedback voltage. This then restores the circuit to its original condition. Since there is no phase inversion when a signal is applied to amplifier 5, the feedback loop will also feed an in-phase signal back to the input which results in high input impedance.

Although the previous discussion has been limited to a specific embodiment, the same feedback circuit can be applied to an amplifier such as the one shown having more than one stage of amplification. Here, the last stage of amplification in the amplifier pair is connected to the output terminal as discussed above and the feedback voltage is applied to the bases of the first stage amplifiers.

Obviously, many modifications and variations of the present invention are possible in the light of the above teachings. It is, therefore, to be understood that within the scope of the appended claim, the invention may be practiced otherwise than as specifically described.

What is claimed is:

1. A quiescent current stabilized transistor amplifier having an input and an output terminal comprising: a first and a second transistor, said first and said second transistors being opposite conductivity type transistors each having a base, an emitter, and a collector electrode; a first capacitor connected in series with said base electrode of said first transistor, and a second capacitor connected in series with said base electrode of said second transistor; a biasing means, said biasing means connected to said collector electrodes for rendering said transistors operative and causing a quiescent current to flow through said transistors, said biasing means including a first resistor connected between said collector and base electrodes of said first transistor, a second resistor connected between said emitter of said first transistor and said base of said second transistor, a third resistor connected between said collector and base electrodes of said second transistor, and a fourth resistor connected between said emitter of said second transistor and said base of said first transistor; a voltage sensing means, said voltage sensing means including a fifth resistor connected between said emitter of said first transistor and said output terminal, a sixth resistor connected between said emitter of said second transistor and said output terminal, said voltage sensing means providing a feedback voltage to stabilize said quiescent current flowing through said first and said second transistors; said base electrodes of said transistors being connected in common to said input terminal of said amplifier through said first and said second capacitors; and said voltage sensing means including an output connection connected through a third capacitor to said output terminal of said amplifier.

References Cited

UNITED STATES PATENTS

| | | | |
|---|---|---|---|
| 2,802,067 | 8/1957 | Zawels | 330—25 X |
| 3,103,601 | 9/1963 | Gordon et al. | 307—88.5 |

OTHER REFERENCES

Electronic Design, Aug. 6, 1958, p. 33.

ROY LAKE, *Primary Examiner.*

JAMES B. MULLINS, *Assistant Examiner.*